United States Patent [19]

Martin

[11] Patent Number: 5,005,173
[45] Date of Patent: Apr. 2, 1991

[54] PARALLEL MODULE TESTING

[75] Inventor: Robert C. Martin, Dallas, Tex.

[73] Assignee: Texas Instruments Incorporated, Dallas, Tex.

[21] Appl. No.: 281,308

[22] Filed: Dec. 7, 1988

[51] Int. Cl.⁵ .......................................... G06F 11/00
[52] U.S. Cl. .................................. 371/22.6; 371/15.1
[58] Field of Search .................. 371/22.6, 22.1, 22.3, 371/22.4, 25.1, 15.1, 16.1; 324/73 R, 73 AT, 73.1, 158 R

[56] References Cited

U.S. PATENT DOCUMENTS

| | | | |
|---|---|---|---|
| 4,180,203 | 12/1979 | Masters | 371/22.6 |
| 4,602,210 | 7/1986 | Fasang | 371/22.3 |
| 4,710,931 | 12/1987 | Bellay | 371/22.3 |
| 4,799,004 | 1/1989 | Mori | 371/22.3 |
| 4,821,269 | 4/1989 | Jackson | 371/22.1 |

Primary Examiner—Jerry Smith
Assistant Examiner—Robert W. Beausoliel
Attorney, Agent, or Firm—W. James Brady, III; James T. Comfort; Melvin Sharp

[57] ABSTRACT

An integrated circuit (10) includes at least one module (12) of operation circuits and also has other operation circuitry. The module (10) has a plurality of operation circuit terminals (98) each of which is operable to be selectively coupled to an external operation circuit terminal (86) or to a respective test terminal (96) by a multiplexer (76). A plurality of peripheral cells (30-40) are provided for connection to conductors external to the chip (10). Each cell (30-40) is bidirectionally coupled to a respective test terminal (42) and is undirectionally coupled to operation circuitry (134, 142, 158, 160) of the chip (10) such that test patterns of a testing program corresponding to the module (12) may be input into selected ones of the cells (30-40). Resulting output signals may be obtained from selected ones of the cells (30-40) that will be unaffected by operation circuitry on the integrated circuit chip exterior to the module (12).

29 Claims, 3 Drawing Sheets

PARALLEL MODULE TESTING

TECHNICAL FIELD OF THE INVENTION

The present invention relates in general to the testing of large scale integrated circuits, and more particularly to a method and apparatus for the testing of megamodules incorporated into integrated circuits.

BACKGROUND OF THE INVENTION

One of the major problems in integrated circuit design is the ability to adequately test the final IC design. This problem increases with increasing complexity of the integrated circuit chip.

Recently, megamodules have been used in the design of application-specific integrated circuits (ASICs). Each of these megamodules, which for example may be RAMS, ROMS, universal asynchronous receiver-transmitters (UARTs), programmable logic arrays or other logic circuits, are usually defined as integrated circuit modules of at least a 500-gate complexity. These megamodules may be predesigned and stored in a library. The megamodules can then be used in the design of an ASIC by placing the design within a certain area on the IC chip.

Conventionally, these megamodules are available as standard catalog devices and are designed without testability. In order to test the ASIC, a custom test program must be developed for that particular chip. Because a custom testing program has to be devised for each custom chip, the costs associated therewith are less than optimum.

More recently, peripheral cells have been provided for input and output during normal operation of the chip, and also for inputting and outputting testing signals of a testing program. These peripheral cells are typically of input, output and input/output types. Testing programs have been previously devised that use input cells for the input test terminals and output cells for the output test terminals. This has the disadvantage of restricting the number of test pins of any type to the number of available signal pins of the same type. A need has therefore arisen for a more flexible testing method and apparatus such that any signal pin of the ASIC chip may be used for any megamodule testing program.

SUMMARY OF THE INVENTION

According to one aspect of the invention, an integrated circuit comprises a module of operation circuits and other operation circuitry external to the module. The module has a plurality of operation circuit terminals. A multiplexer is provided for each of these terminals, and is operable to selectively couple its operation circuit terminal to either an external operation circuit terminal of the multiplexer or a test terminal thereof. The integrated circuit further has a plurality of cells for connection to conductors external to the chip. Each cell is bidirectionally coupled to a respective test terminal of a at least one preselected multiplexer, and is unidirectionally coupled to operation circuitry of the chip. Test patterns of a testing program corresponding to the module may be input into selected ones of the cells, and output signals may be derived from selected ones of the cells without being affected by any operation circuitry exterior to the module. A principal advantage of the invention inheres in the fact that any of the peripheral cells may be used for either the input of a testing program or to record output, or both.

In another aspect of the invention, the integrated circuit further includes at least a second module which may be different from the first module. The second module has a plurality of second multiplexers coupled to operation circuit terminals of the second module. Each of these second multiplexers is connected in parallel with a respective preselected multiplexer of the first module to a preselected one of the cells. Module select circuitry is provided to enable the testing of one of the modules while disabling the remainder of the modules from being tested. Another advantage of the invention inheres in the testing circuit's ability to serially test different modules. A standard testing program corresponding to a first module incorporated in the ASIC may be applied thereto, followed by the application of a second testing program to the second module, etc. Hence, a number of standard testing programs may be used that correspond to the standard megamodules used in the chip, and no custom testing program for the ASIC need be designed to verify operation of the megamodules.

BRIEF DESCRIPTION OF THE DRAWINGS

A more complete understanding of the present invention may be derived by referring to the detailed description and claims when considered in conjunction with the accompanying drawings in which like reference numbers indicate like features throughout the drawings, and wherein:

DETAILED DESCRIPTION OF THE INVENTION

Figure 1:
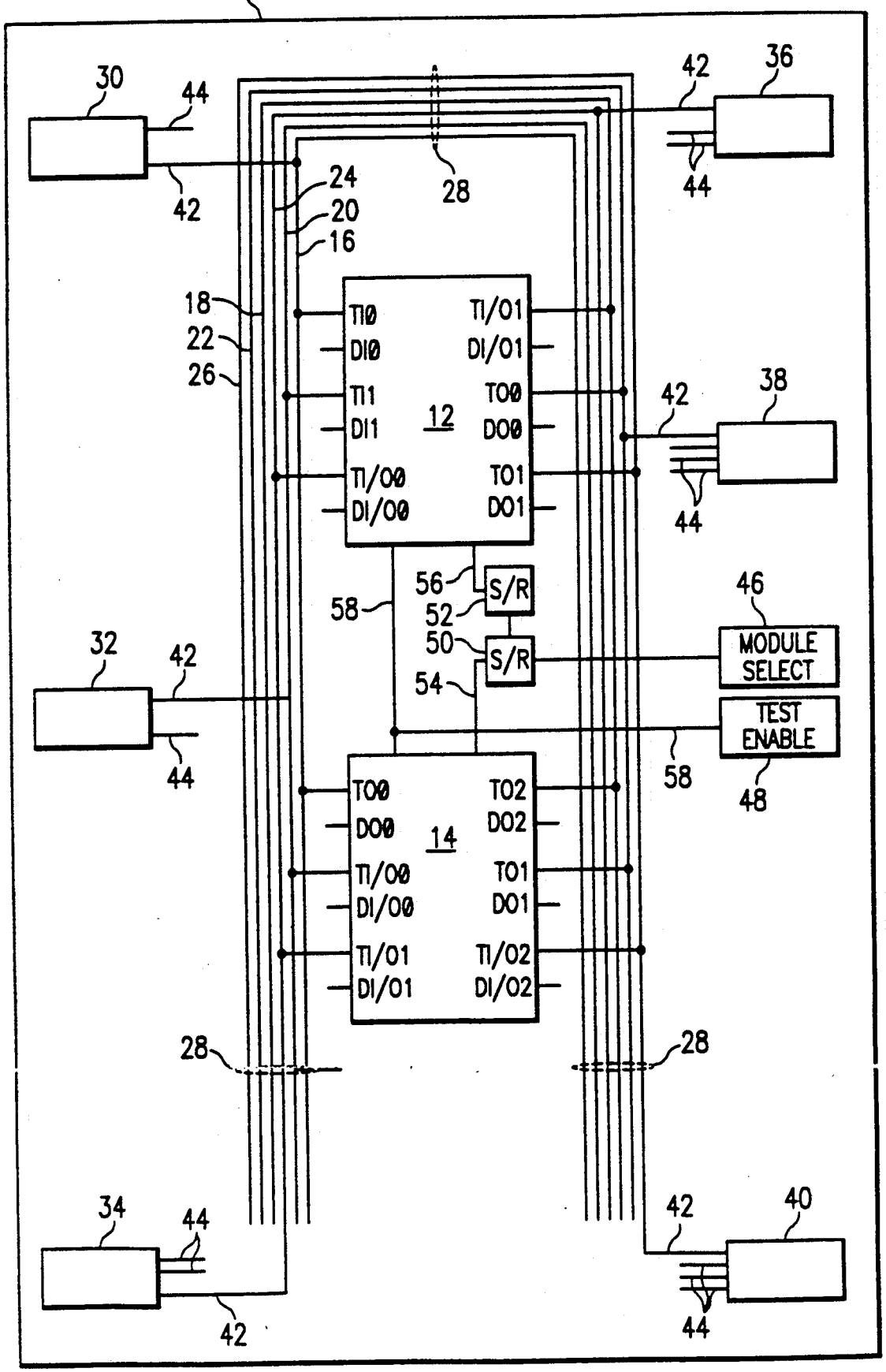
FIG. 1 is a simplified schematic block diagram of an exemplary integrated circuit chip having two megamodules incorporating the parallel module test function of the invention.

FIG. 1 is a simplified schematic plan view of an integrated circuit chip 10 employing the invention. The circuitry on the integrated circuit 10 may be an application-specific integrated circuit (ASIC) and includes a number of megamodules. Two megamodules 12 and 14 are shown in the exemplary embodiment, it being understood that the number of megamodules may vary between one and several. The chip 10 includes a plurality of "core logic" or operation circuits (not shown) that are distinguished from test circuits. Some of the core logic circuits are disposed in the interiors of each of the megamodules 12 and 14. Other core logic circuits may be generally distributed outside megamodules 12 and 14 but still inside the "core" or central area of the chip 10.

Each of the megamodules 12 and 14 consists of a complex circuit, generally including at least 500 active devices. Megamodules 12 and 14 may, for example, be UARTs, programmable logic arrays, random access memories, read-only memories, or any other kind of complex logic circuit. The present invention may also be used in connection with modules of less than 500 devices. Megamodules 12 and 14 may be different from each other and are selected from a design library containing several such megamodules. The use of megamodules is a great aid in the design of application-specific integrated circuits.

Each megamodule 12 and 14 has a plurality of inputs, outputs and bidirectional input/outputs that are connected to the operation circuitry, or core logic, of the megamodule. Thus, megamodule 12 has two inputs DI0 and DI1, two bidirectional lines DI/00 and DI/01, and two outputs D00 and D01. It is to be understood that the depiction of these six data lines is exemplary only. Typically, the number of such inputs, outputs and bidirectional lines may be on the order of 40 or more.

A plurality of the inputs, outputs and bidirectional lines are associated in pairs with respective test lines. Thus, in megamodule 12, the data input DI0 has a test input line TI0, data line DI1 is associated with test line TI1, etc. The data lines DIn, DI/On and DOn are used to interconnect the megamodule 12 to other operation or logic circuitry which may or may not reside in other megamodules such as megamodule 14. The test lines TIn, TI/On and TOn are on the other hand employed in transmitting test patterns to and from the megamodule.

Each test line TIn, TOn, TI/On from any one megamodule is connected to a different test bus line 16, 18, 20, 22, 24 or 26. Test bus lines 16–26 together make up a test bus 28. The test bus 28 is routed such that connections are made to it from each megamodule on the integrated circuit 10. Test lines from different megamodules may be connected to the same test bus line. For example, the test line TI1 of megamodule 12 in the illustrated embodiment is connected to test bus line 20, as is test line TI/00 of megamodule 14. Note that test lines of different types may be connected to the same test line bus. While in the illustrated embodiment the test bus consists of six test lines, the test bus will have as many lines as the greatest number of test lines of any one megamodule on the chip. Thus, there can be several dozen test bus lines like test bus lines 16–26.

Each of the test bus lines 16–26 is connected to a respective peripheral cell 30, 32, 34, 36, 38 or 40. As their name indicates, the peripheral cells 30–40 are located preferably in the peripheral area of the integrated circuit chip 10 and include a conductive bonding pad as will be explained below. Each of the peripheral cells 30–40 has a "pad" or test connection line 42 for connection to a respective test bus line and one or more signal lines 44 that are connected to operation circuitry, that is, circuits used in the normal operation of the integrated circuit 10. The connections of the signal lines 44 to the remainder of the integrated circuit 10 have been omitted for clarity.

Also located in the peripheral area of integrated circuit 10 is a module select peripheral cell 46 and a test enable peripheral cell 48. The designs of peripheral cells 30–40, 46 and 48 may be stored in a cell library for easy design of the ASIC 10. It is to be understood that while six peripheral cells 30–40 are shown, there are typically many more than these. Peripheral cells 30–40 are of different types, as will be more thoroughly explained in conjunction with FIGS. 5a–5c.

The module select cell 46 is connected to a first shift register 50, which in turn is connected to a second shift register 52. The number of shift registers on the integrated circuit chip 10 matches the number of megamodules. Shift register 50 has an output connected to a module select line 54 which in turn is connected to the megamodule 14, while shift register 52 has an output connected to a module select line 56 which in turn is connected to the megamodule 12. The test enable peripheral cell 48 is connected by a test enable line 58 to each megamodule 12 and 14 in the integrated circuit 10.

According to the testing scheme of the invention, the megamodules 12 and 14 are sequentially tested. The module select cell 46 sends a first bit to, or pulses, the shift register 50, which will in turn store a predetermined state and put the megamodule 14 in a test mode. A number of tests are then performed on the megamodule 14. After the test program for the megamodule 14 has been completed, the module select cell 46 sends a further bit or clock pulse to the shift register 50, which in turns shifts a bit of a predetermined state over to the shift register 52. This will deactivate the test mode of the megamodule 14 while activating the test mode of the megamodule 12, allowing it to be tested with a corresponding test program.

As will be explained further below, the test programs need not be the same, but may be individually tailored to the particular megamodules 12 and 14 used. Further, each test program need not be altered to take into account the remaining circuitry in the integrated circuit 10. A principal advantage of the invention is therefore the use of predetermined testing programs that each correspond to a particular megamodule type. These testing programs may be stored and employed whenever a particular megamodule is used to build an ASIC 10. The custom design of an ASIC test program is therefore avoided.

Figure 2:
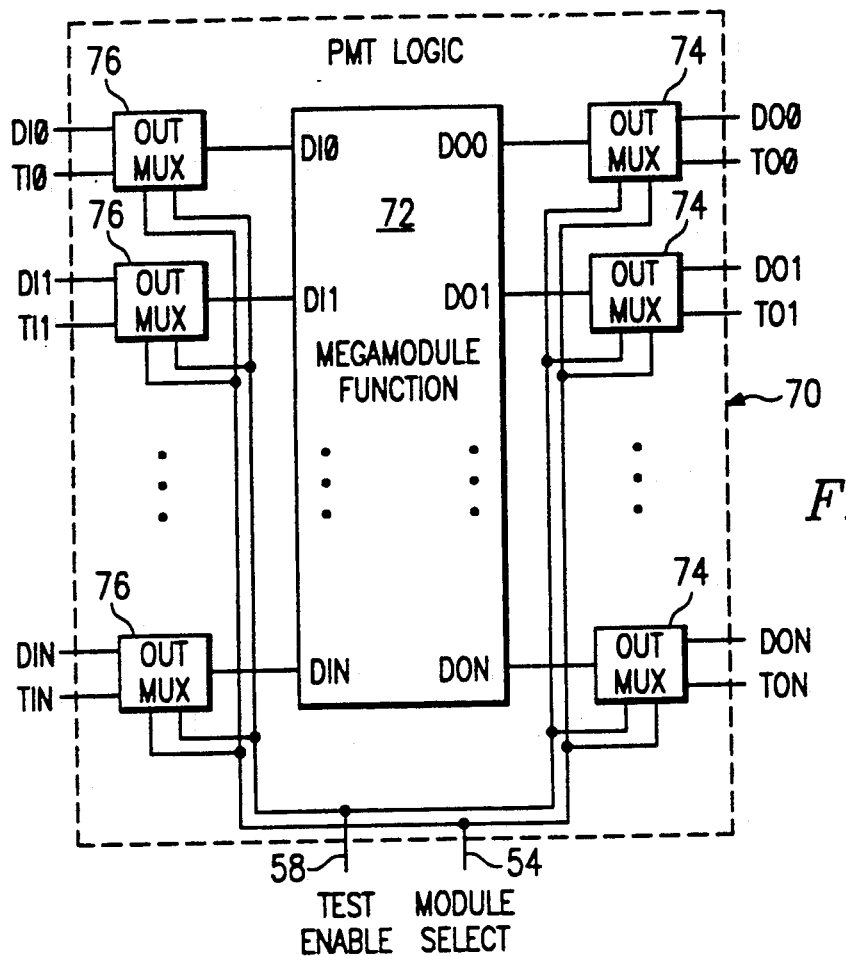
FIG. 2 is a schematic electrical block diagram of a megamodule according to the invention.

FIG. 2 is a schematic electrical diagram of a single parallel module test (PMT) megamodule, which is indicated by the dashed enclosure at 70. Megamodule 70 is similar to the megamodules 12 and 14 shown in FIG. 1. The megamodule 70 includes a megamodule core logic or operation circuit block 72 that has a plurality of data inputs DI0-DIn and a plurality of data outputs DO0-DOn. Although not shown, the megamodule logic circuitry 72 can also have a plurality of bidirectional input/outputs DI/O0-DI/On. For each of its data outputs DO0-DOn, the logic circuitry 72 is provided with an output multiplexer 74. Similarly, each of the inputs DI0-DIn is connected to an input multiplexer 76. Further, input multiplexers 76 would also be provided for any input/output terminals. The module select line 54 is connected to each of the multiplexers 74 and 76, as is the test enable line 58.

Figure 3:
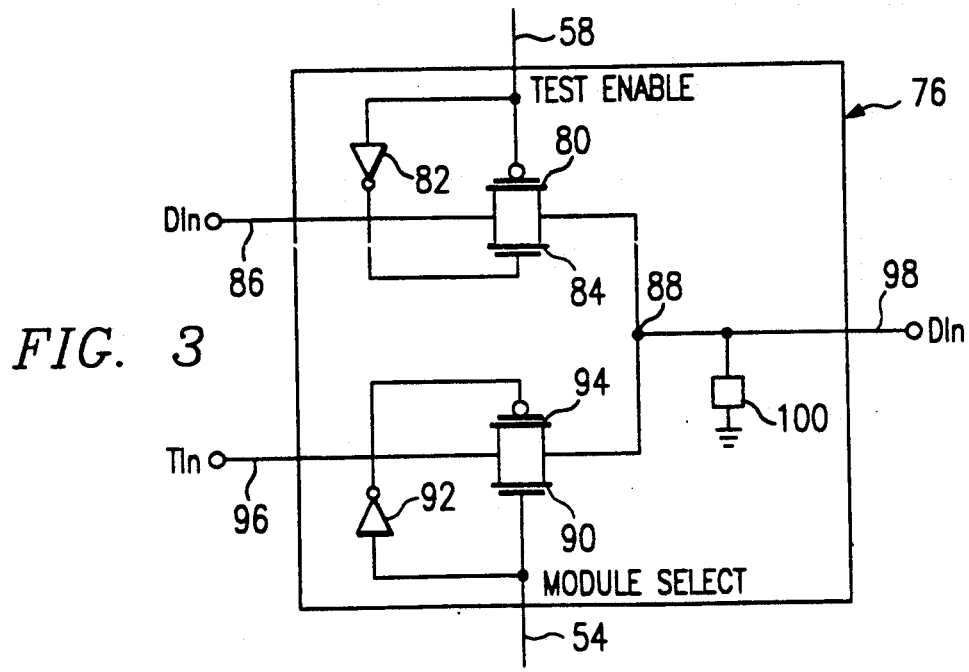
FIG. 3 is a more detailed electrical schematic diagram of an input or input/output multiplexer used in conjunction with the megamodule shown in FIG. 2.

FIG. 3 is a more detailed electrical schematic diagram of an input multiplexer 76 as shown in FIG. 2. The test enable line 58 is connected directly to the gate of a p-channel transistor 80. The test enable signal is also inverted through an inverter 82 and applied to the gate of an n-channel transistor 84. The current path of the p-channel transistor 80 is operable to connect an external operation circuit data input 86 to a node 88. The current path of the n-channel transistor 84 is operable to do likewise. Transistors 80 and 84 will be on at the same time.

In a like manner, the module select line 54 is connected directly to the gate of an n-channel transistor 90. The module select signal is also inverted through an inverter 92 and is then applied to the gate of a p-channel transistor 94. The current paths of transistors 90 and 94 are operable to connect an external test input 96 to the node 88.

The node 88 is connected to a megamodule data input 98. A bus holder 100 is connected to the node 88 and acts as a weak latch to retain the logic state of node 88 until a sufficiently strong signal changes it.

When the test enable signal is low, the multiplexer 76 is operable to connect the external data input 86 to the megamodule data input 98. The module select signal is at this time held low. When the test enable signal is high, the normal data connection is disabled. The logic state at node 88 will be retained by bus holder 100 until a logic "1" is input on line 54. Thereafter, a test pattern may be input from the test bus connection 96 to the data input 98 that may alter the state of node 88. Multiplexer 76 is used for megamodule input connections DIn as well as for bidirectional input/output megamodule connections DI/On.

Figure 4:
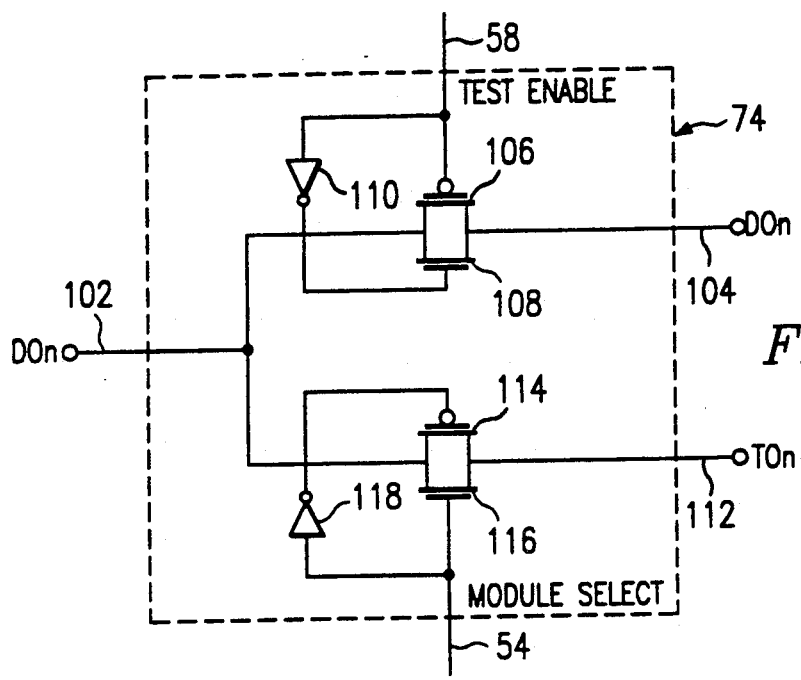
FIG. 4 is a more detailed electrical schematic diagram of an output multiplexer used in conjunction with the megamodule shown in FIG. 2.

For megamodule outputs, an output multiplexer 74 is used, which is illustrated in more detail by FIG. 4. The output multiplexer 74 is in general similar to the input or I/O multiplexer 76, with the omission of the bus holder. Thus, the megamodule output line 102 is connected to an external output data connection 104 through a test enable CMOS transistor pair 106 and 108. The test enable signal is applied directly to the gate of the p-channel transistor 106, and is inverted through an inverter 110 to be applied to the gate of an n-channel transistor 108. The megamodule output 102 is further operable to be connected to a test bus line 112 through the current paths of a CMOS transistor pair 114 and 116. A module select signal is applied through line 54 directly to the gate of an n-channel transistor 116, and is inverted through an inverter 118 and applied to the gate of a p-channel transistor 114. As in the module 76 (FIG. 3), a logic "1" on the test enable line 58 disables the normal data connection between lines 102 and 104. A logic "1" on the module select line 54 will connect the megamodule output 102 to the test bus line 112.

Figure 5A:
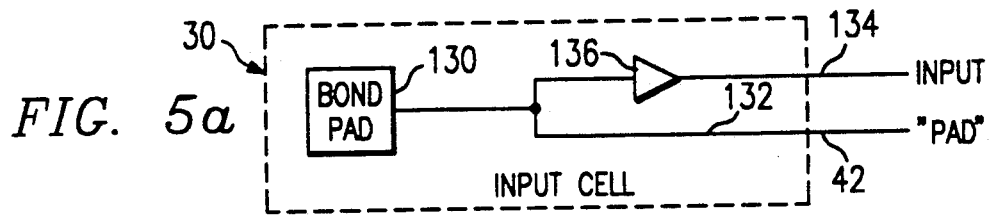
FIG. 5a is a schematic electrical block diagram of an input peripheral cell according to the invention.
Figure 5B:
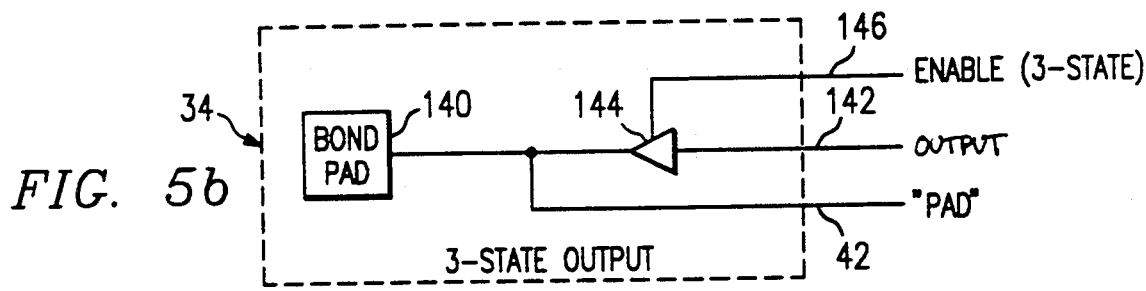
FIG. 5b is an electrical schematic block diagram of an output peripheral cell according to the invention.
Figure 5C:
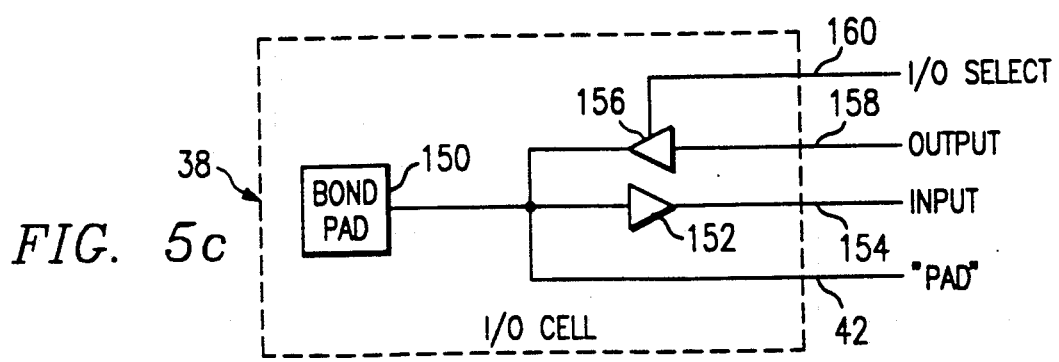
FIG. 5c is an electrical schematic block diagram of an input/output peripheral cell according to the invention.

The peripheral cells 30, 34 and 38 of FIG. 1 are indicated by dashed enclosures in FIGS. 5a–5c, which are more detailed electrical schematic diagrams thereof. FIG. 5a is an electrical schematic diagram of an input cell 30. The input cell 30 includes a bond pad 130 for the connection of an external conductor to the integrated circuit chip 10 (FIG. 1). The conductive bond pad 130 is connected directly through a line 132 to a "pad" output 42. Line 132 is a simplified representation, and may contain passive circuitry such as a clamping circuit or a resistor, but contains no active components. Therefore, line 132 directly and bidirectionally couples the bond pad 130 to the test bus or "pad" input line 42.

The bond pad 130 is connected unidirectionally to a core logic or chip operation circuitry input 134 through a buffer 136 that includes active devices. Circuit 136 may contain an amplifier for driving the line 134 sufficiently to actuate all core logic components connected thereto based on a signal input into circuit 136 being above a predetermined threshold.

A tristate output cell is illustrated in FIG. 5b. The output cell 34 includes a bond pad 140 that is bidirectionally and non-actively connected to a "pad" or test bus connection line 42. The bond pad 140 is further unidirectionally connected to a normal ASIC output 142 through a buffer 144. A tristate enable line 146 will enable or disable the connection made by buffer 144 between the bond pad 140 and the output 142. In the disabled condition, the buffer 144 will exhibit a high-impedance state to the output line 142.

An input/output peripheral cell 38 is shown in FIG. 5c. Like the other peripheral cells 30 and 34, the peripheral cell 38 includes a bond pad 150 that is bidirectionally connected through nonactive components to a test bus connection or "pad" line 42. The bond pad 150 is unidirectionally connected through an active buffer 152 to a core logic or operation circuit input line 154. A tristate buffer 156 is operable to unidirectionally connect the bond pad 150 to a core logic output line 158. A tristate input/output select line 160 is input to enable the connection between pad 150 and line 158, or to alternatively induce a high-impedance state as seen on the output line 158.

A principal advantage of the invention inheres in its use of the peripheral cells 30–38 for test program connections, while at the same time allowing the use of a standard testing program to test a particular module 12 or 14. Referring back to FIG. 1, in operation, a logic "1" will be input from the test enable cell 48 to each of the megamodules 12 and 14. This state will disable the normal logic connections between the logic circuitry 72 (FIG. 2) of the megamodules 12 and 14 and the remaining logic or operation circuitry on the chip 10. A first bit is then input from the module select cell 46 (FIG. 1) to the shift register 50. This will enable module 14 to be tested, while the connections to and from the megamodule 12 remain disabled. The test lines to the megamodule 14 effectively become connected through the test bus 28 to respective ones of the peripheral cells 30–38. Because of these direct and bidirectional connections, a standard testing program corresponding to the standard megamodule 14 may be input into the bond pads 130–150 of the peripheral cells 30–38 (see FIGS. 5a–5c), and the tests on the megamodule 14 completed. No variation of the first megamodule testing program is required to take into account the remaining core logic circuitry.

When the testing on the megamodule 14 is completed, another pulse will be input from the module select cell 46. This will clock the transfer of a "1" bit from shift register 50 to shift register 52. Shift register 50 will thereafter contain a "0" bit which will disable the test inputs of the megamodule 14. A logic "1" bit in the shift register 52 will meanwhile enable the test inputs of the megamodule 12 to be connected through the test bus 28 to the peripheral cells 30–38. A second testing program may next be input using any or all of the cells 30–38. The testing program can be a standard one corresponding to the standard megamodule 12, and need not take into account the remaining core logic circuitry of the chip 10.

In summary, a parallel module testing circuit has been disclosed that allows the testing of one or more megamodules incorporated into an integrated circuit chip with standard testing programs. While an exemplary embodiment has been described in the above detailed description, the invention is not limited thereto but only by the scope and spirit of the appended claims.

What is claimed is:
1. An integrated circuit, comprising:
   at least one module of operation circuits and other operation circuits external to said module;

a plurality of module operation circuit terminals coupled to said module, a plurality of multiplexers coupled to respective ones of said module operation circuit terminals, each multiplexer operable to selectively couple a respective module operation circuit terminal to one of a respective external operation circuit terminal of said multiplexer and a respective test terminal of said multiplexer;

a plurality of cells for connection to conductors external to said integrated circuit, each cell bidirectionally coupled to a respective multiplexer test terminal, such that test patterns of a testing program corresponding to said module may be input into selected ones of said cells and resulting output signals derived from selected ones of said cells.

2. The integrated circuit of claim 1, and further comprising a second module of operation circuits having a plurality of second module operation circuit terminals, each of a plurality of second multiplexers operable to selectively couple a respective second module operation circuit terminal to one of a respective second external operation circuit terminal of said second multiplexer and a respective second test terminal of said second multiplexer;

each test terminal and a respective second test terminal coupled in parallel to a respective one of said plurality of cells; and module select circuitry coupled to said multiplexers and said second multiplexers for selectively enabling either said multiplexers to couple said module operation circuit terminals to said test terminals or said second multiplexers to couple said second module operation circuit terminals to said second test terminals.

3. The integrated circuit of claim 2, wherein said module select circuitry comprises at least first and second shift registers, a module select input coupled to said shift registers for actuating the transfer of a predetermined state between said shift registers, said multiplexers of a respective module coupled to a respective shift register for sensing said predetermined state and enabling the connection of respective module operation circuit terminals to respective test terminals in response thereto.

4. The integrated circuit of claim 1, wherein said module comprises a predesigned module from a standard library of modules, said testing program comprising a standard testing program corresponding to said predesigned module.

5. The integrated circuit of claim 1, wherein said multiplexers include a plurality of input multiplexers and a plurality of output multiplexers, said input multiplexers coupled to respective module operation input circuit terminals, said output multiplexers coupled to respective module operation output circuit terminals, any of said multiplexers operable as both a test input and a test output.

6. The integrated circuit of claim 5, wherein each of said input multiplexers includes a bus holder coupled to said module operation input circuit terminal for latching a logic state thereon.

7. The integrated circuit of claim 1, wherein said plurality of cells include at least one input cell for unidirectionally inputting a signal to at least one of said operation circuits, a connection terminal of said input cell bidirectionally coupled to a respective test terminal by non-active components.

8. The integrated circuit of claim 1, wherein at least one of said plurality of cells comprises an output cell for unidirectionally receiving an output signal from at least one of said operation circuits, a connection terminal of said output cell bidirectionally coupled to a respective test terminal by non-active components.

9. The integrated circuit of claim 8, wherein said connection terminal is coupled to said at least one of said operation circuits by a tristate output buffer which is enabled to unidirectionally transmit a signal from said at least one of said operation circuits to said connection terminal and which is disabled to exhibit a high impedance.

10. The integrated circuit of claim 1, wherein at least one of said cells comprises an input/output cell having a connection terminal, output circuitry for coupling said connection terminal to at least one of said operating circuits for unidirectionally receiving a signal therefrom, input circuitry for coupling said connection terminal to at least one of said operation circuits for unidirectionally transmitting s signal thereto, and non-active circuitry for bidirectionally coupling said connection terminal to a respective test terminal.

11. The integrated circuit of claim 10, wherein said output circuitry comprises a tristate buffer for selectively coupling said connection terminal to said at least one of said operation circuits for unidirectionally receiving a signal therefrom, an input/output select signal source coupled to said tristate buffer for selectively disabling said buffer by placing said buffer in a high impedance state.

12. The integrated circuit of claim 1, wherein said integrated circuit is formed on a semiconductor chip, said cells disposed in a peripheral area of said chip.

13. The integrated circuit of claim 1, wherein said module comprises a megamodule having at least 500 active devices.

14. Apparatus for testing at least one module of operation circuits incorporated into an integrated circuit having other operation circuitry, comprising:

module operation circuitry having a plurality of module terminals for input and output of signals during normal operation:

a plurality of multiplexers coupled to respective ones of said terminals, each multiplexer having a test terminal, an operation terminal of said multiplexer coupled to operation circuitry exterior to said module, each multiplexer operable to couple a respective module terminal to a respective operation terminal during normal operation of said integrated circuit and operable to couple said respective module terminal to a test terminal of said multiplexer during testing of said module; and a plurality of cells for connecting to conductors external to said integrated circuit, each cell having a bidirectional connection to a respective test terminal, such that test patterns of a testing program corresponding to said module may be input into selected ones of said cells and test result output signals may be read from selected ones of said cells.

15. The apparatus of claim 14, and further comprising:

at least a second module of operation circuitry having a plurality of second module terminals for input and output of signals during normal operations;

a plurality of second multiplexers coupled to respective ones of said second module terminals, each second multiplexer having a second operation terminal coupled to operation circuitry exterior to said second module, and a second test terminal, each second multiplexer operable to connect a respective second module terminal to a respecive second operation terminal during normal operation of said integrated circuit and operable to connect said respective second module terminal to a respective second test terminal during testing of said second module;

a bus having a plurality of conductors, each conductor connecting a preselected test terminal and a preselected second test terminal in parallel to a preselected one of said cells; and module select circuitry coupled to said multiplexers for enabling testing of one of said modules while disabling testing of the remainder of said modules, such that one of said modules can be tested at a time.

16. The apparatus of claim 15, wherein said module select circuitry includes a module select terminal, a first signal input on said select terminal operable to enable the testing of one of said modules while disabling the testing of the remainder of said modules, a next signal input on said module select terminal operable to enable the testing of a second of said modules while disabling the testing of the remainder of said modules.

17. The apparatus of claim 15, and further comprising:
test program circuitry coupled to selected ones of said cells for inputting a first testing program for testing the operation cirucitry of a first module when said module select circuitry enables testing of said first module and operable to input a second testing program for testing the operation circuitry of a second module into selected ones of said cells when said module select circuitry enables testing of said second module.

18. The apparatus of claim 14, wherein at least one of said cells comprises an input cell having a connection terminal for connection to a selected conductor external to said integrated circuit, an input buffer unidirectionally coupling said connection terminal to an integrated circuit operation input, and non-active circuitry for bidirectionally coupling said connecton terminal to said respective test terminal.

19. The apparatus of claim 14, wherein at least one of said cells comprises an output cell having a connection terminal for connecting to a selected one of said conductors external to said integrated circuit, an output buffer for unidirectionally coupling an output of said operation circuitry to said connection terminal, and non-active circuitry for bidirectionally coupling said respective test terminal to said connection terminal.

20. A method for testing a module of circuits incorporated into an integrated circuit having other circuitry, comprising the steps of:
decoupling a plurality of module signal terminals from respective normal operation connections to the other circuitry of the integrated circuit;
bidirectionally coupling the signal terminals to respective ones of a plurality of cells for coupling to conductors external to said integrated circuit; and
inputting test patterns and sensing test result output signals through selected ones of said cells.

21. The method of claim 20, and further including the steps of:
enabling a selected one of a plurality of modules for testing; and
disabling the remainder of said modules while the selected module is being tested.

22. The method of claim 20, and further comprising the steps of:
enabling a first module for testing and disabling the remainder of the modules;
inputting test patterns of a first test program designed for the first module and sensing first test result output signals;
enabling a second module for testing and disabling the first module;
inputting test patterns and sensing test result output signals in accordance with a second testing program designed for testing the second module; and
repeating said steps of enabling, disabling, inputting and sensing for each of a plurality of successive modules until all of said modules have been tested.

23. The method of claim 20, wherein said cells include input cells for unidirectionally inputting external data to operation circuitry and output cells for unidirectionally transmitting signals from operation circuitry to external connection terminals of said output cells, the method further comprising the step of:
choosing testing inputs and outputs among said cells irrespective of whether said cells are input cells or output cells.

24. The method of claim 20, and further including the steps of:
disabling each of a plurality of multiplexers of each of a plurality of modules from connecting respective module signal terminals to the other circuitry; and
enabling the multiplexers of a selected one of the modules to make connections between the module signal terminals of said module and respective ones of said cells.

25. An integrated circuit, comprising:
a first module of operation circuits, said first module having a plurality of first data terminals;
a plurality of first multiplexers, each of said first multiplexers having a first external data terminal and a first test terminal, each of said first multiplexers coupling a respective one of said first data terminals to said first external data terminal during normal operation and to said first test terminal during testing of said first module to permit test patterns of a testing program corresponding to said first module to be input into said first module;
a second module of operation circuits, said second module having a plurality of second data terminals;
a plurality of second multiplexers, each of said second multiplexers having a second external data terminal and a second test terminal, each of said second multiplexers coupling a respective one of said second data terminals to said second external data terminal during normal operation and to said second test terminal during testing of said second module to permit test patterns of a testing program corresponding to said second module to be input into said second module; and
a bus for coupling to a source of test patterns, said bus having a plurality of conductors, each of said first test terminals and said second test terminals coupled to one of said plurality of conductors.

26. The integrated circuit of claim 25, further comprising:
control circuitry coupled to said first and second multiplexers, said first and second multiplexers responsive to control signals from said control circuitry for coupling said first and second data terminals to said first and second external data terminals during normal operation and uncoupling said first and second data terminals from said first and second external data terminals while sequentially coupling said first data terminals to said first test terminals during testing of said first module and then coupling said second data terminals to said second test terminals during testing of said second module.

27. The integrated circuit of claim 26 in which said control circuitry includes test enable circuitry coupled to said first and second multiplexers, said first and second multiplexers responsive to a first signal from said test enable circuitry to couple said first and second data terminals to said first and second external data terminals and responsive to a second signal from said test enable circuitry to uncouple said first and second data terminals from said first and second external data terminals.

28. The integrated circuit of claim 26 in which said control circuitry includes module select circuitry coupled to said first and second multiplexers, said first and second multiplexers responsive to a first signal from said module select circuitry to couple said first and second data terminals to said first and second test terminals and responsive to a second signal from said module select circuitry to uncouple said first and second data terminals from said first and second test terminals.

29. The integrated circuit of claim 25, further comprising a plurality of cells for connection to conductors external to said integrated circuit, each cell having a bidirectional connection to a respective one of said plurality of conductors.

* * * * *